(12) United States Patent
Chiu (10) Patent No.: US 6,621,733 B2
(45) Date of Patent: Sep. 16, 2003

(54) SEGMENTED BIT LINE EEPROM PAGE ARCHITECTURE

(75) Inventor: Te-Long Chiu, San Jose, CA (US)

(73) Assignee: Turbo IC, Inc., San Jose, CA (US)

( * ) Notice: Subject to any disclaimer, the term of this patent is extended or adjusted under 35 U.S.C. 154(b) by 0 days.

(21) Appl. No.: 10/082,698

(22) Filed: Feb. 25, 2002

(65) Prior Publication Data

US 2002/0135013 A1 Sep. 26, 2002

Related U.S. Application Data

(62) Division of application No. 09/470,212, filed on Dec. 22, 1999, now Pat. No. 6,359,305.

(51) Int. Cl.[7] ............................................. G11C 16/04
(52) U.S. Cl. ........................ 365/185.06; 365/230.03; 365/185.25
(58) Field of Search ...................... 365/185.06, 230.03, 365/53, 61, 185.25

(56) References Cited

U.S. PATENT DOCUMENTS

| | | | | |
|---|---|---|---|---|
| 5,780,890 A | * | 7/1998 | Hazama | 257/316 |
| 5,784,325 A | * | 7/1998 | Arase et al. | 365/185.18 |
| 5,877,524 A | * | 3/1999 | Oonakado et al. | 257/321 |
| 6,005,810 A | * | 12/1999 | Wu | 365/185.33 |
| 6,038,170 A | * | 3/2000 | Shiba | 365/185.13 |
| 6,101,123 A | * | 8/2000 | Kato et al. | 365/185.11 |
| 6,215,699 B1 | * | 4/2001 | Yamamoto | 365/185.09 |
| 6,282,145 B1 | | 8/2001 | Tran et al. | 365/230.06 |

* cited by examiner

Primary Examiner—Vu A. Le
Assistant Examiner—Toan Le
(74) Attorney, Agent, or Firm—Andrei D. Popovici

(57) ABSTRACT

An EEPROM segment bit line page memory array includes a plurality of bit lines extending in a Y-direction; a plurality of word lines extending in an X-direction; a plurality of sub-bit lines extending in the Y-direction; a plurality of segment select word lines extending in the X-direction; a plurality of segment select devices arranged in a segment select row; and a plurality of EEPROM floating gate memory devices arranged in the X- and Y-directions. Each of the segment select devices connects one of the sub-bit lines to a corresponding one of the bit-lines. Plural gates of the segment select devices in each segment select row are connected to one of the segment select word lines. Each of the memory devices connects adjacent sub-bit lines, and corresponding control gates of plural memory devices in a memory device row arc electrically connected to one of the word lines.

2 Claims, 13 Drawing Sheets

TOP VIEW
FIG. 1A

CROSS SECTION 1-1
FIG. 1B

CROSS SECTION 2-2
FIG. 1C

TOP VIEW
FIG. 2A

CROSS SECTION 1-1
FIG. 2B

CROSS SECTION 2-2
FIG. 2C

TOP VIEW
FIG. 3A

CROSS SECTION 1-1
FIG. 3B

CROSS SECTION 2-2
FIG. 3C

TOP VIEW
FIG. 4A

CROSS SECTION 1-1
FIG. 4B

CROSS SECTION 2-2
FIG. 4C

TOP VIEW
FIG. 5A

CROSS SECTION 1-1
FIG. 5B

CROSS SECTION 2-2
FIG. 5C

TOP VIEW

FIG. 6A

CROSS SECTION 1-1

FIG. 6B

CROSS SECTION 2-2

FIG. 6C

TOP VIEW
FIG. 7A

CROSS SECTION 1-1
FIG. 7B

CROSS SECTION 2-2
FIG. 7C

TOP VIEW
FIG. 8A

CROSS SECTION 1-1
FIG. 8B

CROSS SECTION 2-2
FIG. 8C

TOP VIEW
FIG. 9A

CROSS SECTION 1-1
FIG. 9B

CROSS SECTION 2-2
FIG. 9C

TOP VIEW
FIG. 10A

CROSS SECTION 1-1
FIG. 10B

CROSS SECTION 2-2
FIG. 10C

TOP VIEW
FIG. 11A

CROSS SECTION 1-1
FIG. 11B

CROSS SECTION 2-2
FIG. 11C

FIG. 12

TOP VIEW
FIG. 13A

CROSS SECTION 1-1
FIG. 13B

CROSS SECTION 2-2
FIG. 13C

SEGMENTED BIT LINE EEPROM PAGE ARCHITECTURE

RELATED APPLICATION DATA

This application is a divisional of U.S. patent application Ser. No. 09/470,212, filed Dec. 22, 1999, now U.S. Pat. No. 6,359,305, entitled "Trench-Isolated EEPROM Flash in Segmented Bit Line Architecture," which is herein incorporated by reference.

BACKGROUND OF THE INVENTION

The present invention relates to semiconductor devices, in particular to electrically erasable programmable read-only memories (EEPROM).

Conventional EEPROMs include a selection device connected in series with a memory device. The selection device controls the flow of current to the memory device. The memory device has a floating gate positioned over the channel and the tunnel dielectric area on the drain, and a stacked control gate positioned over the floating gate. Programming the memory device is achieved by applying a suitable potential across the drain and the control gate of the memory device to cause charge carriers to tunnel through the tunnel dielectric from the floating gate to the drain. Erasing the memory device is achieved by applying a suitable potential across the control gate and the drain of the memory device to cause charge carriers to tunnel through the tunnel dielectric from the drain to the floating gate.

The tunnel dielectric area on the drain of the memory device can be defined using conventional photoengraving technology. The area required to accommodate the tunnel dielectric is normally relatively large due to the dimensional limitations and alignment tolerance of conventional photoengraving technology. Thus, the resolution of the photoengraving technique can place an upper bound on memory cell density.

The tunnel dielectric area on the drain of the memory device can be reduced significantly using a self-aligned tunnel dielectric area approach, as disclosed in U.S. Pat. Nos. 5,021,848 and 5,019,879. In this approach, the tunnel dielectric area is not defined by conventional photoengraving in the channel direction. Rather, photoengraving is used to define the floating gate and to align the floating gate to the channel in the direction perpendicular to the channel direction.

With the advance of trench isolation techniques, the separation between adjacent diffusion lines is no longer necessarily limited by electrical isolation requirements. Instead, the separation is limited by the requirement of aligning an extension of the gate to form an endcap on the field oxide, and by the minimum spacing between adjacent end caps due to the photolithographic limitation.

In conventional EEPROMs, the selection device in series with the memory device can be eliminated, as disclosed in U.S. Pat. No. 5,355,347, by using a bit line page programming technique. In this technique, the drains of all single transistor memory cells in a column are connected to a bit line, the control gates of all single transistor memory cells in a row are connected to a word line, and the sources of all memory cells in each sector are connected to a sector select line. A typical array layout according to this technique requires one contact opening for the metal bit line interconnection shared by two adjacent memory cells, and the area required for the contact opening occupies about 40% of total memory cell area.

Conventional semiconductor devices use oxide or nitride spacers at the gate edge in the source and the drain area to form lightly doped source-drain structures under the oxide or nitride spacers. Devices using such structures may exhibit high series resistance and high body effect, which are ordinarily reduced by the voltage applied to the gate.

SUMMARY OF THE INVENTION

The present invention provides an EEPROM memory device with a channel and floating gate self-aligned to field oxide in an isolation trench. An add-on floating gate forms both a self-aligned endcap on the field oxide and a self-aligned tunnel area on a buried drain. The present invention further provides a method of fabricating the same, as well as a proposed segmented bit line page memory array architecture. The proposed architecture and the method of forming the self-aligned end cap allow increasing the storage density of the array.

The proposed EEPROM floating gate memory device has a floating gate disposed over the channel between the buried drain and the buried source and insulated from the channel by 200 Å to 1000 Å of gate oxide, an add-on floating gate shorted electrically to the floating gate and disposed over and insulated from the buried drain by 15 Å to 150 Å of tunnel dielectric, and a control gate disposed and insulated from the floating gate and the channel between the floating gate and the buried source. Both the floating gate and the channel underneath are self-aligned to and flanked by the field oxide in the trench along a direction perpendicular to the channel current flow. The add-on floating gate forms the self-aligned end cap on the field oxide. The proposed memory device allows a reduction in memory cell size.

This memory cell is suited for use in a proposed segmented bit line page memory array architecture with the common drain diffusion line and the common diffusion source line both in a Y-column direction, and with the common control gate line in an X-row direction. The architecture uses a reduced number of contact openings, and allows the use of a smaller surface area per memory cell.

In the proposed segmented bit line page memory array architecture, the drains of 4 to 4096 of the proposed memory cells within the same column and the sources of 4 to 4096 proposed memory cells within the adjacent column are commonly connected to a single sub-bit line. The sub-bit line is connected to a bit line in the Y-column direction through a segment select device with its gate connected to a segment select word line in the X-row direction. The control gates of all the proposed memory cells within the same row are connected to the same word line in the X-row direction.

The present invention further provides an improved method of fabricating a semiconductor device during the fabrication of the proposed EEPROM memory cell. In the preferred embodiment, the self-aligned end cap on the field oxide and the poly spacer over the drain area are formed at the same time, after the lightly doped source and drain and the hallow implanted areas are formed. The proposed method of device fabrication provides for device size reduction and added flexibility in drain engineering for deep sub-micron device technology. The lightly doped source and the drain under the polysilicon spacer electrically connected to the gate can reduce the body effect and the series resistance of the device when the voltage is applied to the gate of the device to conduct current in the channel.

The preferred fabrication method includes the steps of using an active area (or diffusion) mask to define photoresist patterns on a nitride layer deposited on a first polysilicon layer, which in turn is deposited on a first gate oxide on the semiconductor substrate. Then the nitride layer, the first polysilicon layer, and the first gate oxide layer outside of the photoresist patterns are etched away. The exposed semiconductor substrate is subjected to a semiconductor etch to form shallow trenches between the active area photoresist patterns. After removing the photoresist patterns, a thin oxide layer is grown. Then a thin layer of nitride is deposited and etched back in an anisotropic etch to keep the thin nitride layer at the side wall of the trenches and also at the side wall of the first polysilicon on first gate oxide patterns.

A thick field oxide is grown in the trenches to form the field isolation structures, since the remaining area is covered by the nitride and no field oxide can be grown. Thus, the first polysilicon layer patterns are self-aligned to the field oxide in the trenches. Then the nitride and the first poly patterns are etched into the first poly gates of the non-memory devices and the floating gates of the EEPROM memory cells, using the first gate pattern mask to define the gate area. A thin nitride layer is again deposited and etched away except at the side wall of the first polysilicon patterns. This side wall nitride prevents the side wall of the first polysilicon patterns from growing oxide during the tunnel oxidation.

In the EEPROM memory cell areas, the buried drain areas are defined, the oxide in the buried drain areas is etched off, and arsenic and/or phosphorus are implanted to form buried drain for the EEPROM memory cells. A thin tunnel oxide is grown in the buried drain areas.

The next several steps are for the source drain engineering of the semiconductor devices. The source and the drain area of any N-channel devices are defined. The N-channel source and drain areas are then doped with a deeper boron anti-punch-through hallow implant, and a shallower light drain implant at slightly heavier phosphorus or arsenic doses. The source and drain areas of any P-channel devices are then defined. The P-channel source and drain areas are doped with a deeper phosphorus anti-punch-through hallow implant, and a shallower light drain implant at slightly heavier BF2 dose. The above-described drain engineering allows fabricating short-channel-length devices with relatively heavier anti-punch-through implant doses, while suppressing the body effect of the devices because of the shallow light conductive drain at the surface channel.

After the formation of the buried drain for the EEPROM memory cells and after the drain engineering steps for the semiconductor devices, all nitride at the side wall of the first polysilicon gate is removed. The add-on polysilicon layer is deposited right afterward, in intimate contact with the side wall of the first polysilicon gate. Then, an add-on polysilicon pattern mask is used to define inter-connection patterns for the first polysilicon gates. The add-on polysilicon patterns are smaller than the first polysilicon gate patterns of the semiconductor devices such that the gate edges at the source and the drain areas are at the outside of the add-on polysilicon patterns. The first polysilicon floating gate areas of the EEPROM memory cells are not overlapped by the add-on polysilicon patterns.

The add-on polysilicon outside of the add-on polysilicon patterns is then etched back in an anisotropic etch such that the poly spacer is formed around the side wall of the first polysilicon floating gate patterns of the EEPROM memory cells. The poly spacer is also formed at the side wall of the first polysilicon gate patterns of the semiconductor devices outside of the add-on polysilicon patterns. The poly spacer on the field oxide attached to the first polysilicon gate forms the self-aligned end cap of the first polysilicon gate. The poly spacer attached to the first polysilicon gate in the active areas of the semiconductor devices becomes the self-aligned source drain overlap on the lightly doped source drain areas. The poly spacer attached to the first polysilicon floating gate over the buried drain areas of EEPROM memory cell forms the tunnel oxide areas of the EEPROM memory cell, while the poly spacer attached to the first polysilicon floating gate over the field oxide areas of EEPROM memory cell forms the self-aligned end cap of the first polysilicon floating gate.

A high voltage source drain implant window is then formed and implanted to form a high voltage source drain junction of the EEPROM memory cells and semiconductor devices. This method of simultaneously forming the small self-aligned source drain overlap area and the self-aligned end cap of semiconductor devices, as well as forming the self-aligned tunnel oxide area and the self-aligned end cap of the first polysilicon floating gate of EEPROM memory cell at the same time is incorporated in the preferred embodiment of the EEPROM in the trench isolated fabrication process.

BRIEF DESCRIPTION OF THE DRAWINGS

The scope of the invention is set forth in the appended claims. The invention itself and other features as well as advantages thereof, can best be understood by reference to the detailed description which follows, read in conjunction with the accompanying drawings, wherein:

DETAILED DESCRIPTION OF THE INVENTION

In the following description, the statement that a first layer is formed or deposited on a second layer does not exclude the presence of an intermediate layer between the first and second layers. The statement that a layer or structure is "thin" is understood to mean that the layer or structure has a thickness not exceeding 1000 Å. The statement that a layer or structure is "thick" is understood to mean that the layer or structure has a thickness of 2000 Å or more.

The following description illustrates embodiments of the invention by way of example and not necessarily by way of limitation.

Figure 1A:
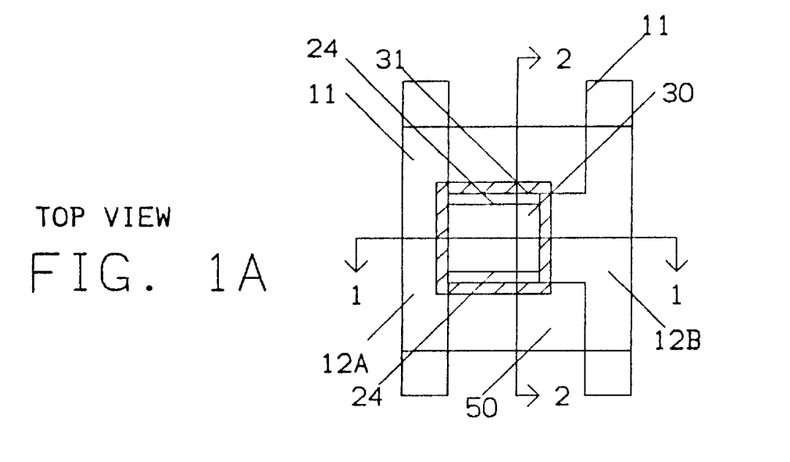
FIGS. 1A through 1C show a top view and two cross-sectional views along 1—1 and 2—2 of an EEPROM memory cell according to an embodiment of the present invention.
Figure 1B:
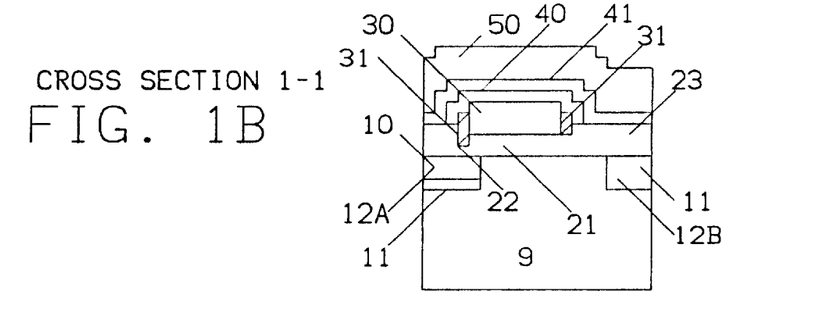
Figure 1C:
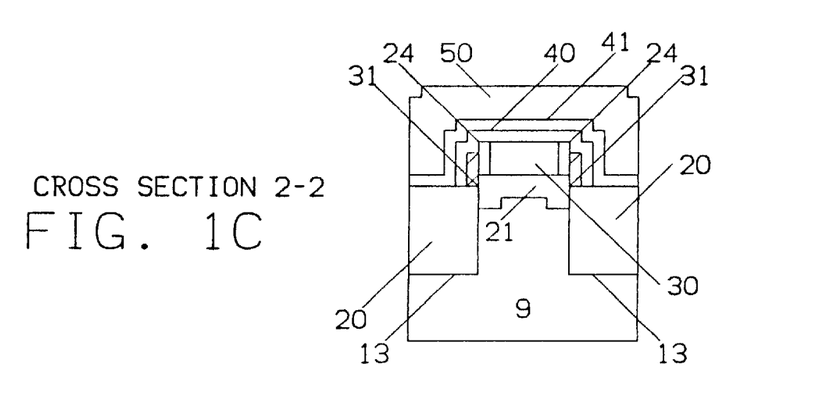
Figure 2A:
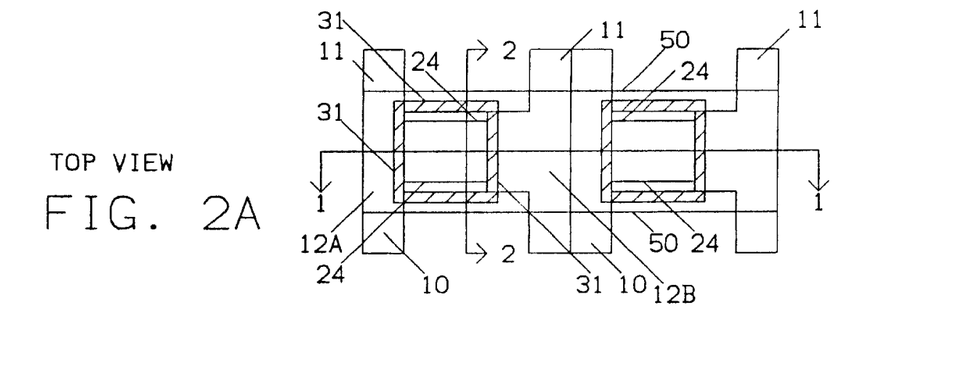
FIGS. 2A through 2C show a top view and two cross sectional views along 1—1 and 2—2 of two EEPROM memory cells connected in a NOR gate array arrangement, according to the present invention.
Figure 2B:
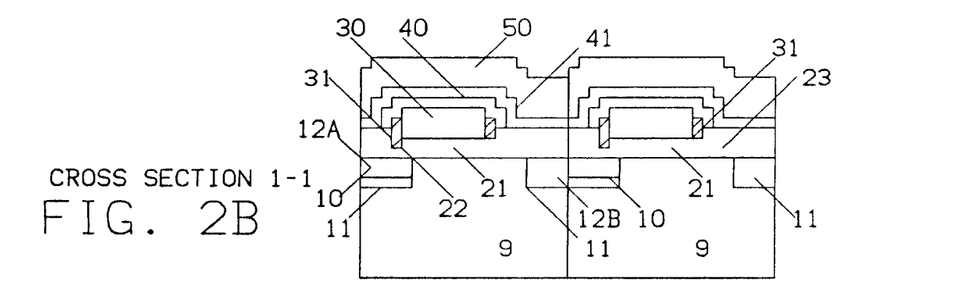
Figure 2C:
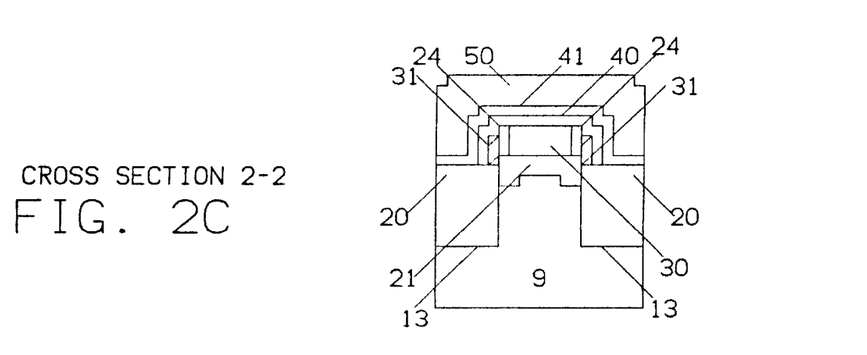

FIGS. 1A through 1C illustrate a preferred EEPROM cell according to the present invention. FIGS. 2A through 2C show two EEPROM cells connected side by side in one row, according to the preferred embodiment of the present invention. An EEPROM memory cell of the preferred embodiment is constructed on a P-type substrate 9 of monocrystalline silicon or the like. Buried N+junctions 10, 11 formed in substrate 9 define a buried drain 12a and source 12b of the EEPROM. A conductive channel is defined within substrate 9, between drain 12a and source 12b. A floating gate 30 is disposed over the channel area, and is separated from the channel area by a gate oxide 21.

An add-on floating gate or spacer 31 is shorted electrically to the floating gate 30. Add-on floating gate 31 forms a tapered, seamlike appendix around the edge of floating gate 30. Add-on floating gate 31 is disposed over buried drain 12a, and is separated from buried drain 12a by a tunnel dielectric 22. Add-on floating gate 31 is also disposed over a field oxide area 20 outside of the conductive channel. The part of add-on floating gate 31 extending over field oxide 20, laterally with respect to the conductive channel, forms an endcap for the device. The endcap serves to limit the leakage of current from the conductive channel along the lateral edges of the conductive channel.

A control gate 50 is disposed over the floating gate 30 and the add-on floating gate 31, and is separated from floating gates 30, 31 by inter-poly dielectric layers 40 and 41. The buried drain 12a is disposed under the add-on floating gate 31. The buried drain 12a is also disposed under the control gate 50, and is separated from the control gate 50 by an inter-poly dielectric 41 and an oxide layer 23. The buried source 12b is disposed under the control gate 50, and is separated from the control gate 50 by inter-poly dielectric 41 and oxide layer 23. The buried source 12b is not overlapped by the floating gate 30 and the add-on floating gate 31. A field oxide layer 20 serves as isolation between different EEPROM cells.

When a suitable potential is applied to the control gate 50 while the buried drain 12a is grounded during the erase operation, electrons move from the buried drain 12a through the tunnel dielectric 22 to the add-on floating gate 31 by tunneling. When a suitable potential is applied to the buried drain 12a while the control gate 50 is grounded during the write operation, electrons move from the add-on floating gate 31 through the tunnel dielectric 22 to the buried drain 12a by tunneling.

If there are excess electrons at the floating gate 30 and the add-on floating gate 31, the positive voltage required at the control gate 50 for passing current through the channel underneath the floating gate 30 becomes higher. On the other hand, if there is a deficit of electrons at the floating gate 30 and the add-on floating gate 31, the positive voltage required at the control gate 50 for passing current through the channel underneath the floating gate 30 becomes lower. Therefore, whether or not there is current flow through the channel underneath the floating gate 30 at a given voltage at the control gate 50 represents whether "1" or "0" is stored in the EEPROM memory cell.

The channel between the floating gate 30 and the source 12b serves to eliminate the channel leakage current from the drain 12a to the source 12b when the floating gate 30 is in deficit of electrons and the control gate 50 is at ground after the write operation. The channel between the floating gate 30 and the source 12b may be eliminated, particularly if a self-regulated write operation is employed to ensure that there is no leakage current from the drain 12a to the source 12b after the write operation, when the control gate 50 is grounded.

Figure 3A:
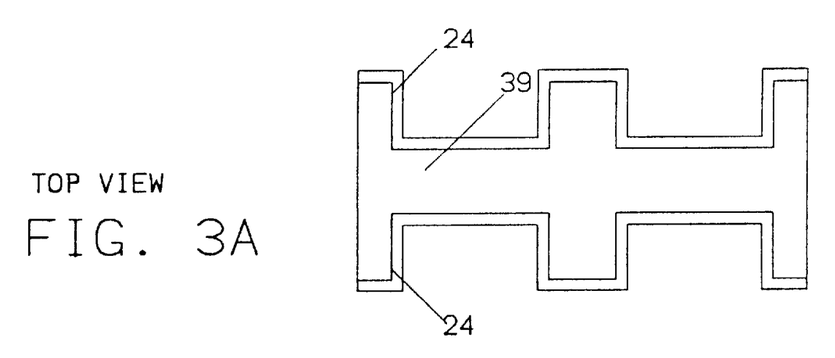
FIGS. 3A through 3C show a top view and two cross sectional views along 1—1 and 2—2 of a structure used in the fabrication of the cells of FIGS. 2A through 2C, after an active area patterning during the fabrication of the cells.
Figure 3B:
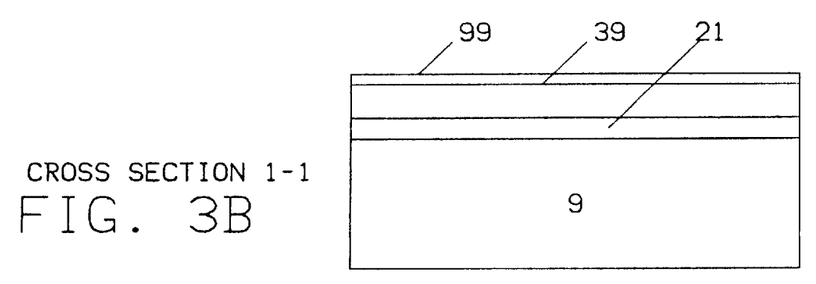
Figure 3C:
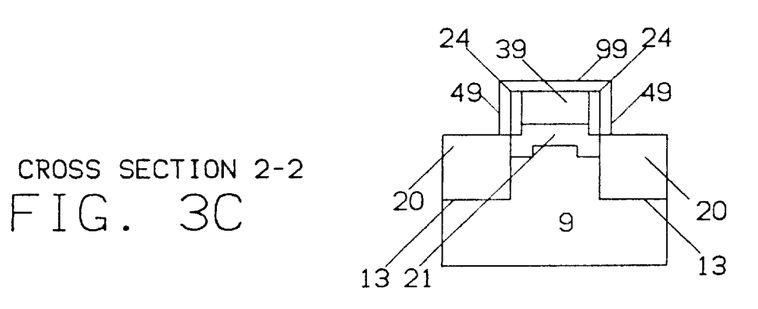

The fabrication of two EEPROM memory cells shown in FIGS. 2A through 2C shall now be described in detail with reference to FIGS. 3A through 6C. For clarity of presentation, an N-channel EEPROM memory array will be used as an example. A P-type single crystal of silicon will be used as the starting substrate. As shown in FIGS. 3A through 3C, a first gate oxide 21 is initially grown on the P-substrate 9. Gate oxide 21 preferably has a thickness of 60 Å to 450 Å. A first polysilicon layer 39 is then deposited on first gate oxide 21. A CVD nitride layer 99 is deposited on first polysilicon layer 39. A photoresist pattern for an active area is formed on top of CVD nitride layer 99. CVD nitride layer 99, first polysilicon layer 39, and first gate oxide 21 are etched off outside of the active area photoresist pattern. Then a thickness of 500 Å to 6000 Å of silicon is etched off from the surface of the exposed P-substrate 9 outside of the active area photoresist pattern, to form an isolation trench 13.

With the photoresist patterns still on, boron ions are implanted into the area outside of the active area photoresist pattern, at the bottom of the isolation trench 13, in order to improve the field isolation between adjacent active areas. The photoresist patterns are then stripped off. A thin pad oxide layer and a thin CVD nitride layer are sequentially deposited and etched back to retain a pad oxide 24 and a CVD nitride layer 49 only along the side wall of first polysilicon layer 39. A thick field oxide 20 is then grown within isolation trench 13, in the area not covered by CVD nitride layers 99 and 49. FIGS. 3A through 3C show top and cross sectional views of the structure resulting after these process steps.

Figure 4A:
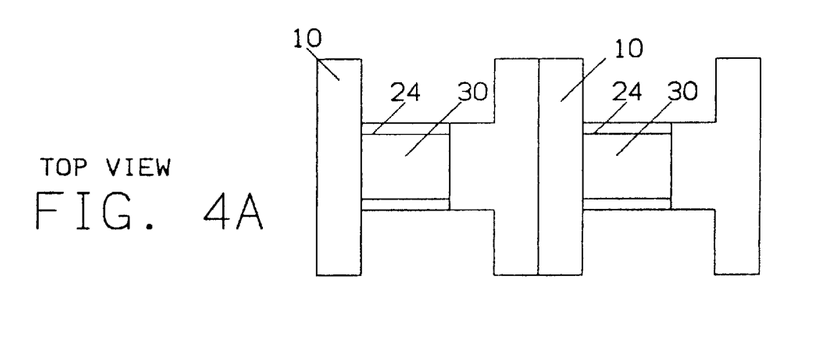
FIGS. 4A through 4C show a top view and two cross sectional views along 1—1 and 2—2 of the structure of FIG. 3A, after a first polysilicon floating gate formation and gate patterning during the fabrication of the cells.
Figure 4B:
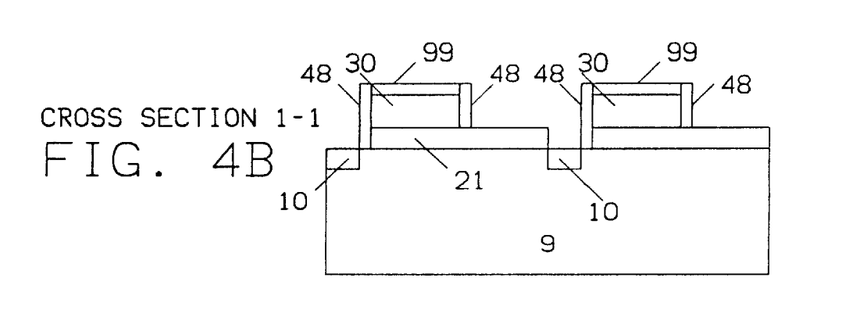
Figure 4C:
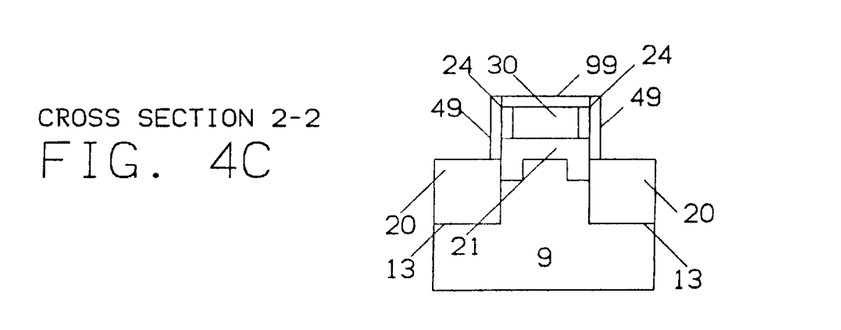

Referring to FIGS. 4A through 4C, a photoresist pattern for the first polysilicon floating gate is formed, and first polysilicon layer 39 is etched off outside of the floating gate photoresist pattern to retain only first polysilicon floating gate 30. After the photoresist pattern is stripped off, a thin CVD nitride layer is deposited and etched back to retain a CVD nitride structure 48 only along the sidewall of floating gate 30. A photoresist window pattern is formed to define the buried drain area 10. The gate oxide 21 is etched off within the photoresist window pattern, and phosphorus or arsenic ions are implanted into the photoresist windows to form buried drain/source area 10. The photoresist window pattern is then stripped off. FIGS. 4A through 4C show top and cross-sectional views of the structure resulting after the photoresist window pattern is stripped off.

Figure 5A:
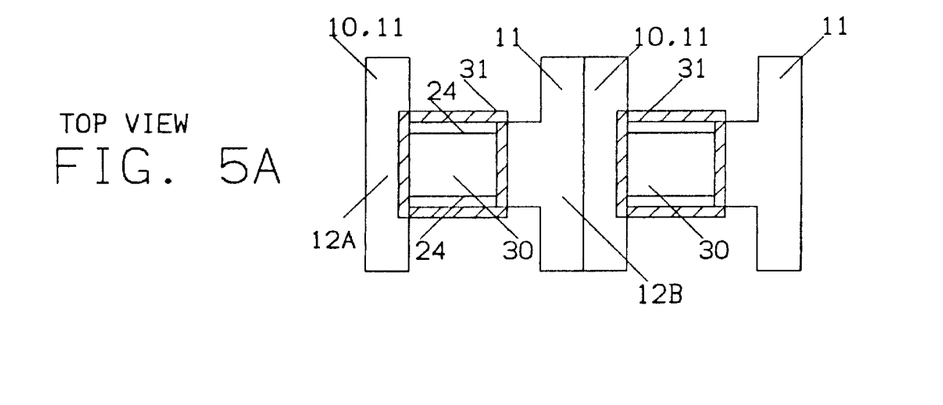
FIGS. 5A through 5C show a top view and two cross sectional views along 1—1 and 2—2 of the structure of FIG. 3A, after an add-on polysilicon etching to form a poly spacer during the fabrication of the cells.
Figure 5B:
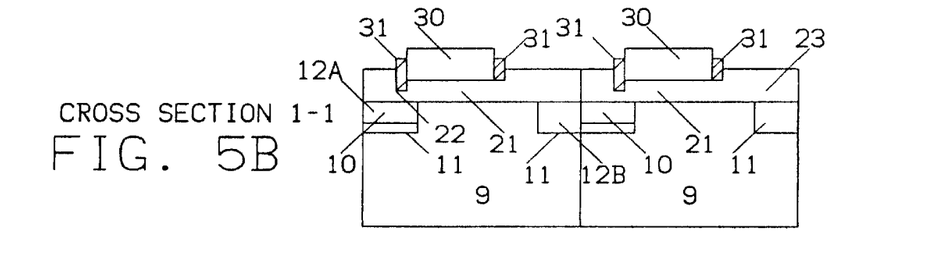
Figure 5C:
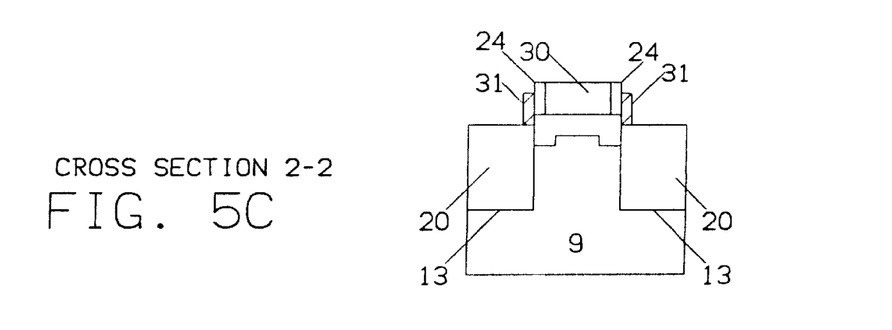

Referring now to FIGS. 5A through 5C, the tunnel oxide 22 is subsequently grown above buried drain 12a. The thin nitride structures 48 and 49 at the side wall of the first polysilicon floating gate 30 are etched off in hot phosphoric acid, and add-on polysilicon is deposited and is etched back to form a seamlike add-on spacer/appendix 31 attached along the side-wall of the first polysilicon floating gate 30. With this proposed embodiment, the small self-aligned tunnel area is formed in the buried drain area underneath the spacer 31 at the same time as the self-aligned end cap is also formed by the poly spacer 31 on the field oxide 20.

Source and drain photoresist window patterns are formed, and phosphorus or arsenic ions are implanted into the photoresist windows to form the source and the drain area 11. After the photoresist patterns are stripped off, a thin oxide layer is grown in the buried drain area 10, and the nitride layer 99 on top of the first polysilicon floating gate is stripped back. FIGS. 5A through 5C show top and cross sectional views of the structure resulting after these process steps.

Figure 6A:
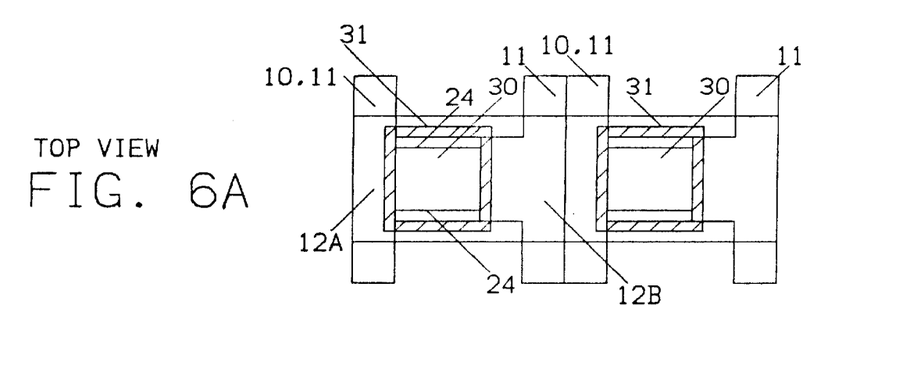
FIGS. 6A through 6C show a top view and two cross sectional views along 1—1 and 2—2 of the structure of FIG. 3A, after a second polysilicon layer patterning to form a control gate during the fabrication of the cells.
Figure 6B:
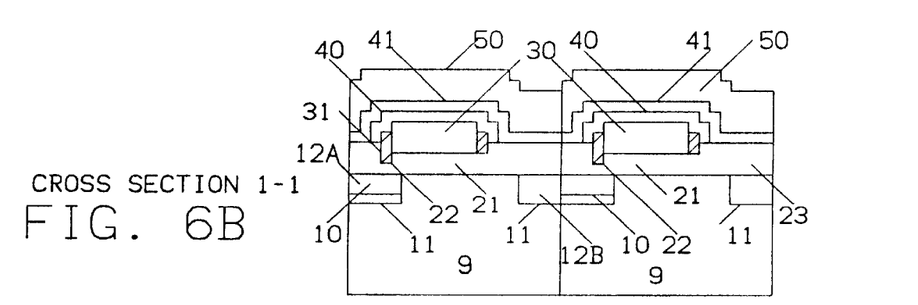
Figure 6C:
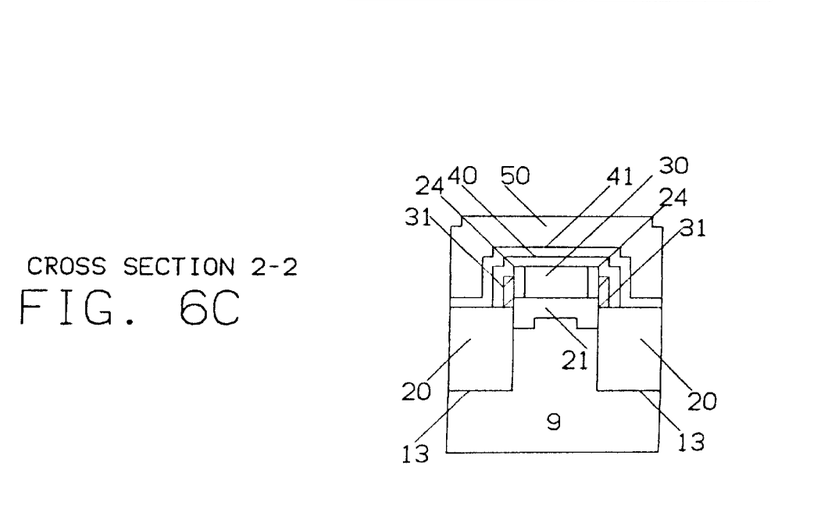

Then, an interpoly dielectric ONO is formed by growing an oxide layer 40, depositing a nitride layer 41, and oxidizing the surface of the nitride layer 41. The second polysilicon layer is deposited, doped, and control gate pattern 50 is defined thereon. FIGS. 6A through 6C show top and cross sectional views of the structure resulting after these process steps.

Figure 7A:
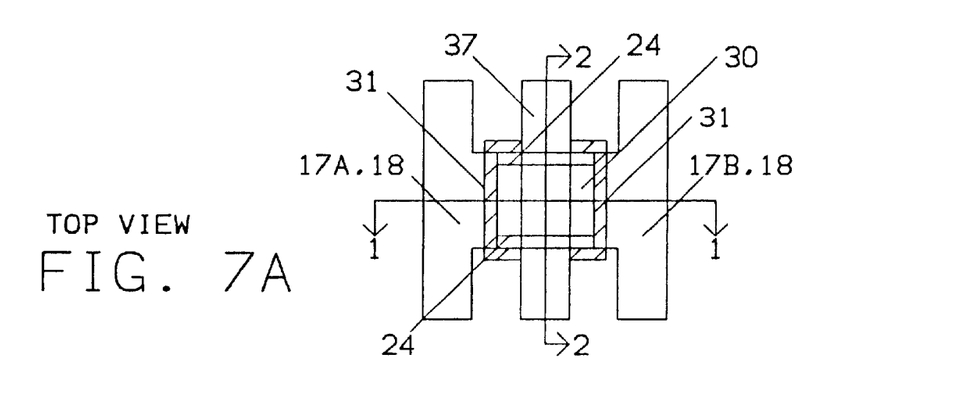
FIGS. 7A through 7C show a top view and two cross sectional views along 1—1 and 2—2 of a device that can be constructed at the same time as the EEPROM memory cells of FIG. 2A, according to an embodiment of the present invention.
Figure 7B:
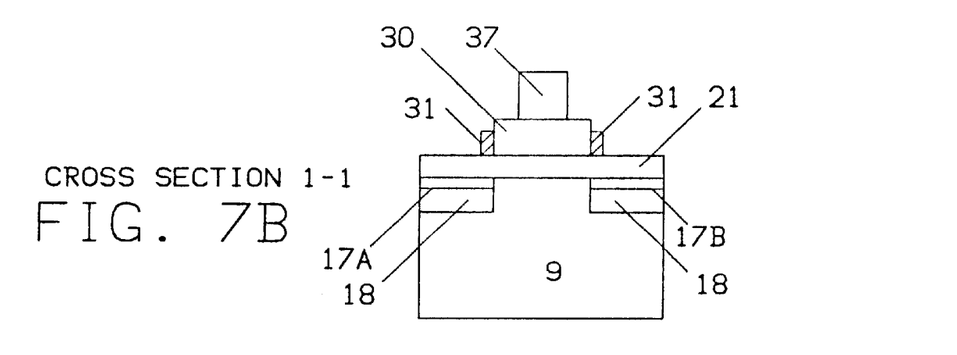
Figure 7C:
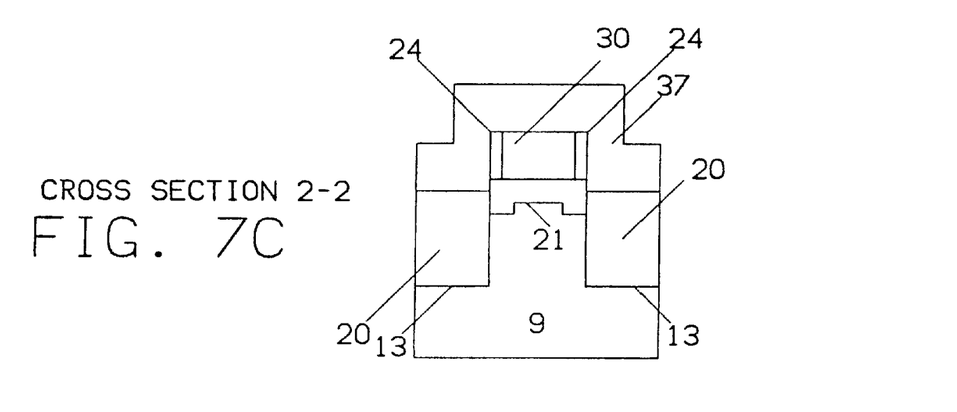

FIGS. 7A through 7C illustrate a non-memory, first polysilicon transistor device that can be fabricated simultaneously with the cells shown in FIGS. 2A through 2C. The first polysilicon device is constructed on P-type substrate 9. The first polysilicon device includes both a polysilicon gate 30 and an add-on polysilicon gate 31 electrically connected to the polysilicon gate 30. A conductive channel is defined within substrate 9, between an N-type drain 17a and an N-type source 17b. The polysilicon gate 30 is disposed over the channel area and separated from the channel area by a layer of gate oxide 21. The add-on polysilicon gate 31 is disposed over drain 17a and source 17b, and are separated from the N-type drain 17a and the N-type source 17b by the oxide layer 21. Both the N-type drain 17a and the N-type source 17b are adjacent to a P-type hallow implanted area 18. The thick field oxide 20 is at both sides of the channel, and serves as the isolation between different devices.

The fabrication of the first polysilicon device shown in FIGS. 7A through 7C will now be described in detail, with reference to FIGS. 8A through 11C. For clarity of presentation, an N-channel first polysilicon device with a P-type single crystal silicon substrate will be used as an example. A first gate oxide 21 of 60 Å to 450 Å in thickness is initially grown on the P-substrate 9. The first polysilicon layer 39 is then deposited on the first gate oxide 21. Then the CVD nitride layer 99 is deposited on the first polysilicon layer 39. The photoresist patterns of the active area are formed on top of the CVD nitride layer 99. The CVD nitride layer 99, the first polysilicon layer 39, and the first gate oxide 21 outside of the active area photoresist patterns are etched off.

Figure 8A:
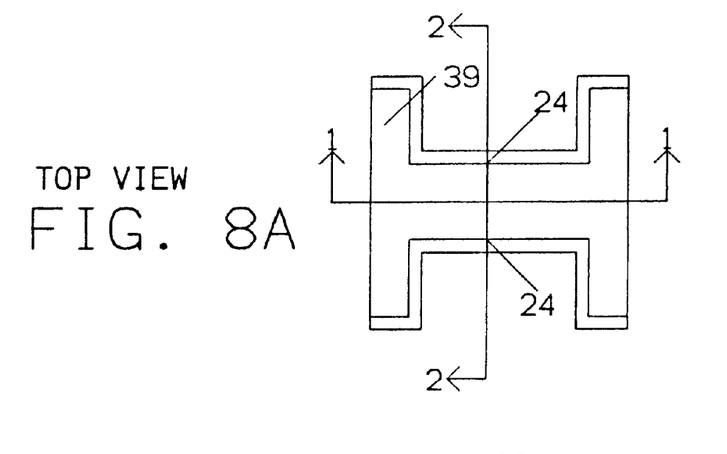
FIGS. 8A through 8C show a top view and two cross sectional views along 1—1 and 2—2 of a structure used in the fabrication of the device of FIGS. 7A through 7C, after an active area mask patterning during the fabrication of the device.
Figure 8B:
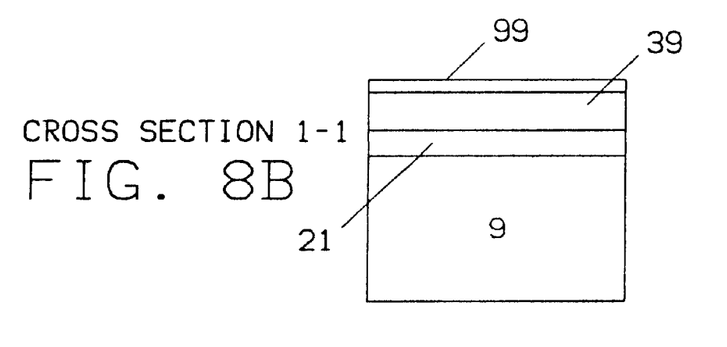
Figure 8C:
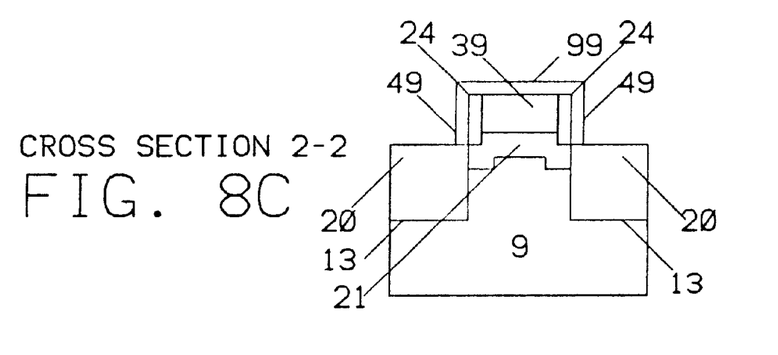

A thickness of 500 Å to 6000 Å of silicon is etched off from the surface of the exposed P-substrate 9 outside of the active area photoresist patterns, to form an isolation trench 13. With the photoresist patterns still on, boron ions are implanted into the area outside of the active area photoresist patterns, in order to improve the field isolation between adjacent active areas. The photoresist patterns are stripped off, and a thin pad oxide 24 is grown over the resulting structure. A thin CVD nitride is deposited and etched back to retain the thin CVD nitride layer 49 only along the side-wall of first polysilicon layer 39. A thick field oxide 20 is then grown within trench 13, in the area not covered by the CVD nitride layers 99 and 49. FIGS. 8A through 8C show top and cross-sectional views of the resulting structure.

Figure 9A:
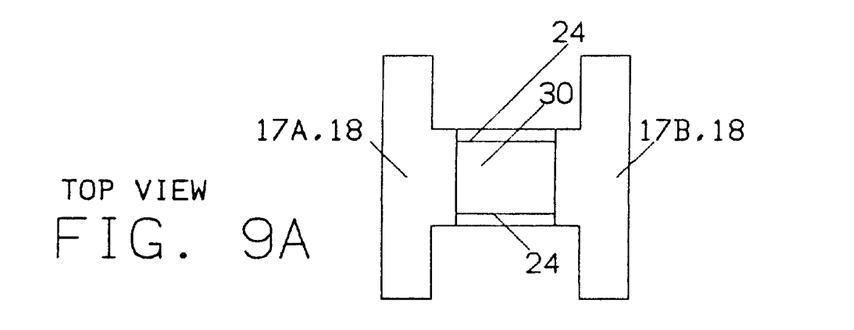
FIGS. 9A through 9C show a top view and two cross sectional views along 1—1 and 2—2 of the structure of FIGS. 8A through 8C after a first polysilicon floating gate formation and gate patterning during the fabrication of the device of FIGS. 7A through 7C.
Figure 9B:
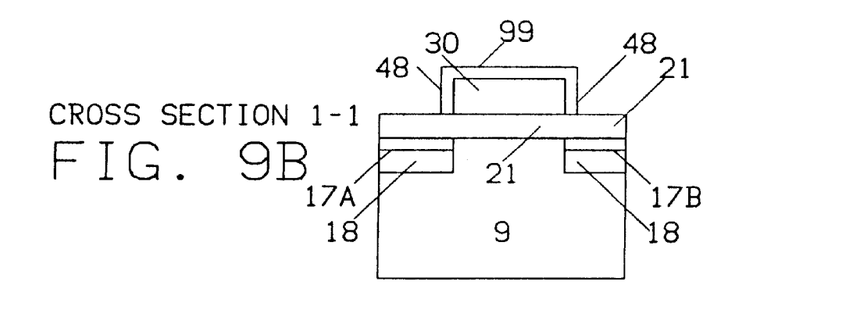
Figure 9C:
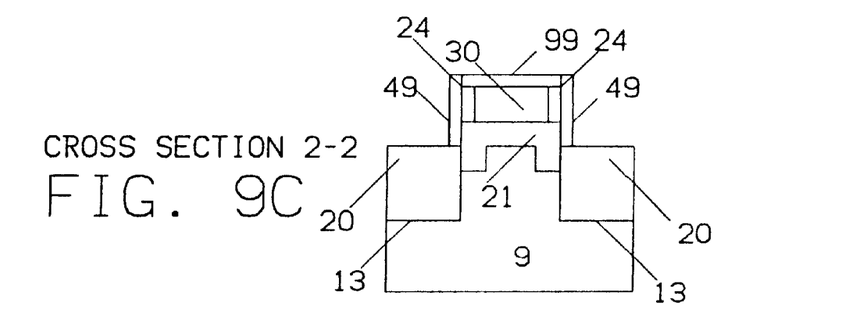

Photoresist patterns for the first polysilicon gate 30 are formed, and the first polysilicon 39 outside of the photoresist patterns is etched off to retain only the first polysilicon gate 30. After the photoresist patterns are stripped off, a thin CVD nitride layer is deposited and etched back to retain a thin CVD nitride structure 48 only along the side wall of gate 30. Photoresist window patterns are formed to define the drain 17a and the source area 17b of the N-channel devices, and boron ions are implanted to form hallow implant 18. Phosphorus or arsenic ions are implanted into the photoresist windows to form the lightly doped N-type drain 17a and N-type source 17b of the first polysilicon devices. FIGS. 9A through 9C show top and cross-sectional views of the resulting structure after the photoresist patterns are stripped off.

Figure 10A:
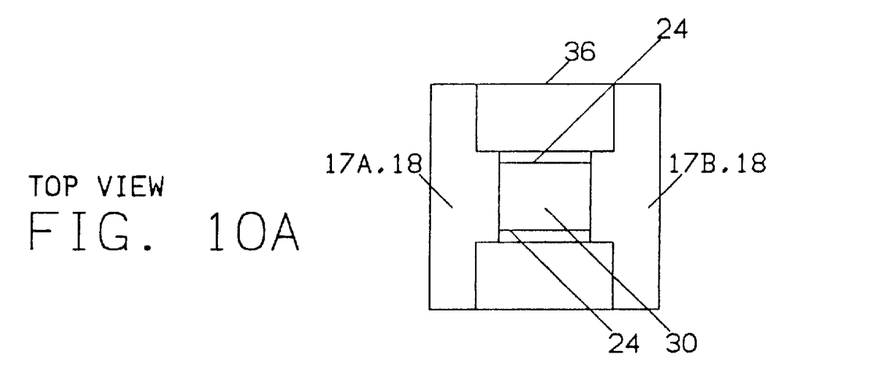
FIGS. 10A through 10C show a top view and two cross sectional views along 1—1 and 2—2 of the structure after the add-on polysilicon deposition during the fabrication of the device.
Figure 10B:
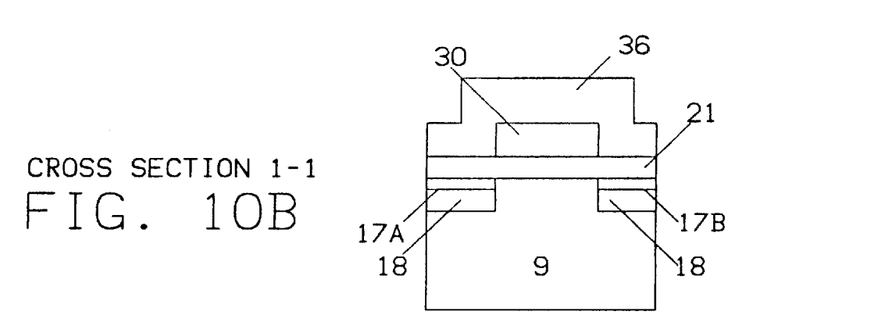
Figure 10C:
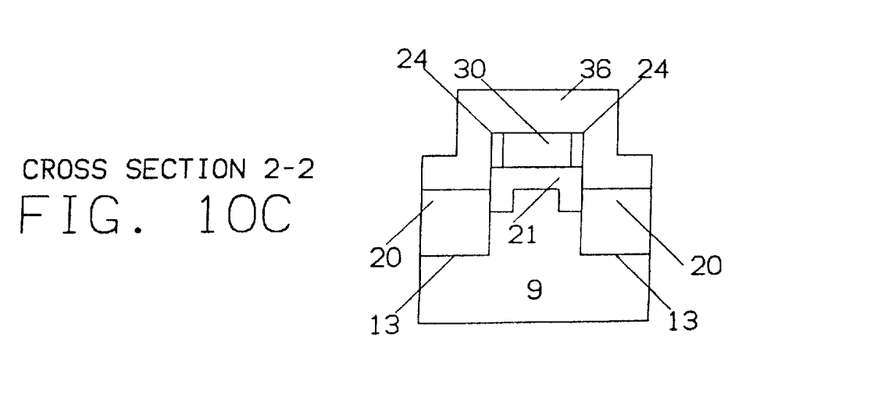

A new blocking photoresist pattern is formed to protect the EEPROM memory cell area and expose the first polysilicon device area. The nitride 99 on the first polysilicon gate 30 is then etched off. After the photoresist blocking pattern is removed, the thin nitride 48 at the side-wall of the first polysilicon gate 30 is etched off in hot phosphoric acid, and add-on polysilicon 36 is then deposited. Top and cross-sectional views of the structure after this process step are shown in FIGS. 10A through 10C.

A photoresist interconnection pattern is formed on top of the add-on polysilicon 36. The add-on polysilicon 36 is etched back in an anisotropic etch to remove the add-on polysilicon that is outside of the interconnection pattern, leaving behind an interconnection line 37. The interconnection pattern is narrower than the first polysilicon gate pattern of the first polysilicon device, in order to ensure that the source and the drain gate edges are outside of the interconnection pattern. Polysilicon spacers 31 at the side-wall of the first polysilicon gate edges at the source and the drain area of the first polysilicon devices are also formed during this process step. The photoresist pattern is then removed. Top and cross sectional views of the structure after this process step are shown in FIGS. 11A through 11C.

Figure 11A:
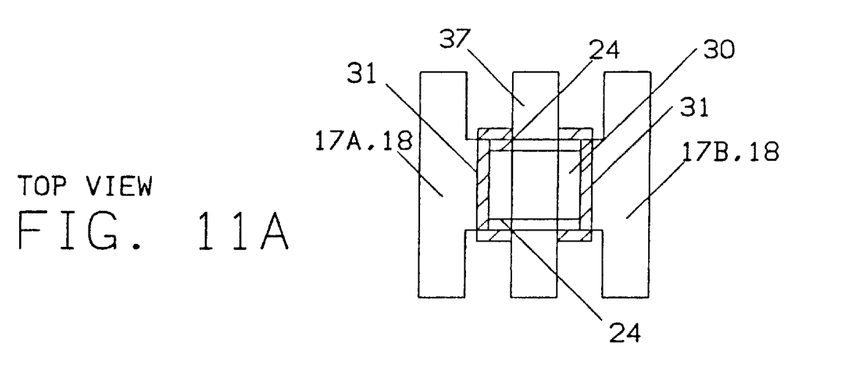
FIGS. 11A through 11C show a top view and two cross sectional views along 1—1 and 2—2 of the structure after the add-on polysilicon layer patterning and etch back during the fabrication of the device of FIGS. 7A through 7C.
Figure 11B:
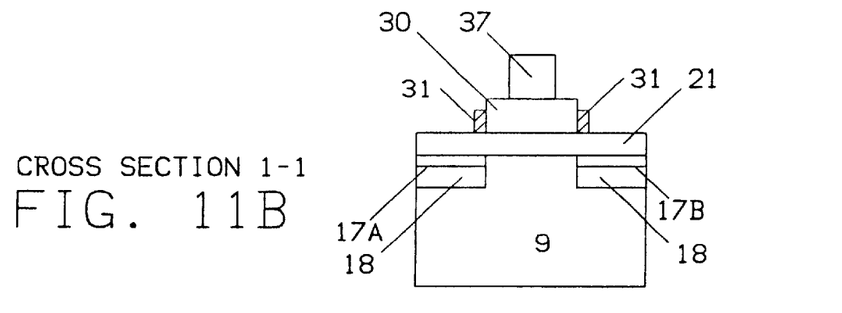
Figure 11C:
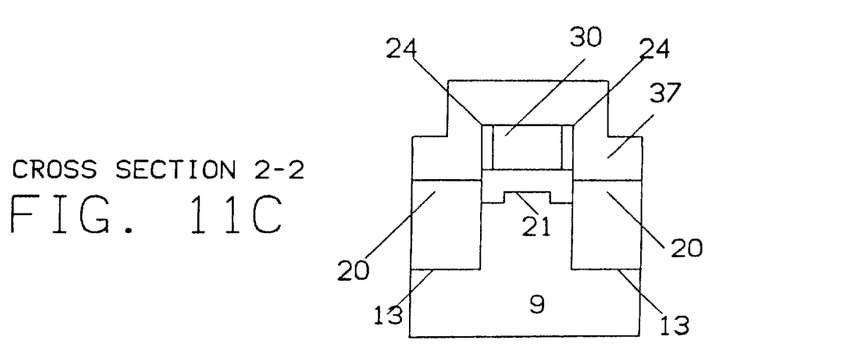

In FIGS. 11A through 11C, the combination of the interconnect line 37 and the poly spacer 31 at the side-wall of the first poly gate outside of the interconnect line on the field oxide 20 forms the end cap of the first polysilicon device. The poly spacer 31 at the sidewall of the polysilicon gate over the source and the drain area provides the flexibility in performing different combination of lightly doped source/drain area 17 and the hallow implant area 18 to yield the optimum low body effect and high punch through device parameters. This first polysilicon device also has low series resistance to the device when a voltage is applied to the gate to conduct current in the channel.

The above-described memory and non-memory devices are particularly suited for use in a bit line page memory array architecture of the present invention. The architecture allows further increasing the storage density of an array of the present invention by reducing the number of required metal contacts, as explained in more detail below. The drains of 4 to 4096 of the proposed memory cells within the same column and the sources of 4 to 4096 proposed memory cells within the adjacent column are connected to the same single sub-bit line. All sub-bit lines are connected to a bit line in a Y-column direction through a segment select device with its gate connected to a segment select word line in the X-row direction. The control gates of all the proposed memory cells within the same row are connected to the same word line extending in the X-row direction.

Figure 12:
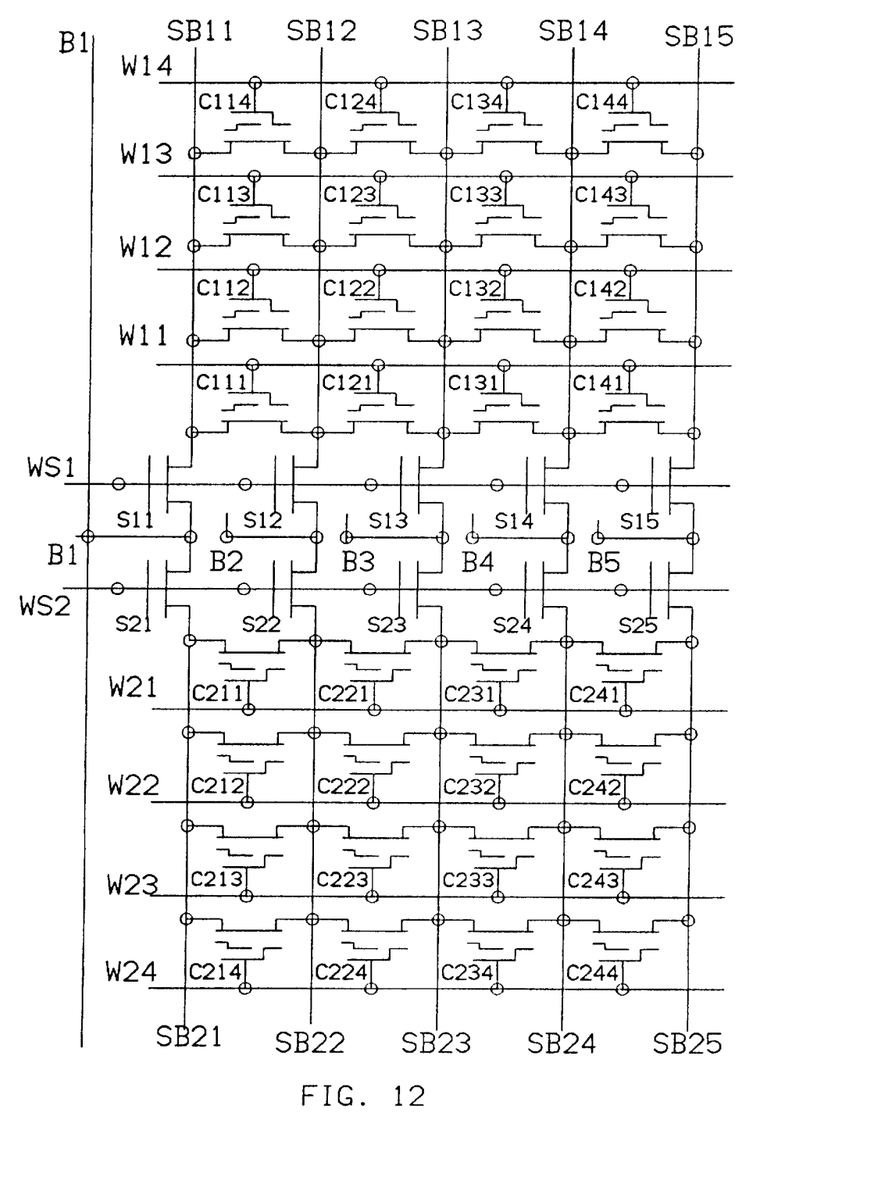
FIG. 12 is a schematic diagram of an EEPROM memory array connected in a segmented bit line page array architecture in accordance to the preferred embodiment of the present invention.

FIG. 12 illustrates a bit line page memory array architecture according to the preferred embodiment of the present invention. Points of electrical communication between crossed lines are illustrated as circles; other line crossings are insulative. Thirty-two memory cells corresponding to five bit lines and eight word lines are shown for illustrative purposes. A plurality of memory cells Cijk are arranged in a Cartesian array in both X-row and Y-column directions. Memory cells Cijk are arranged in plural segments, which in turn are arranged in plural sectors. The index i denotes sector identity, j denotes segment identity, and k denotes memory cell identity. Preferably, the array also includes a plurality of segment select devices Sij.

The array further comprises a plurality of conductive bit lines Bn, n=1 . . . 5, and sub-bit lines Sbin, n=1 . . . 5, extending over the semiconductor substrate in a Y column direction. For clarity of presentation, only parts of bit lines B2–5 are shown; bit lines B2–5 are similar to bit line B1. A plurality of conductive word lines Wik and segment select word lines WSi extend in an X row direction.

An exemplary segment delineated between sub-bit lines SB11 and SB12 will now be described in detail. The segment comprises four memory cells C111–114 arranged along the Y-column direction, and a segment select device S1 for connecting sub-bit line SB11 to bit line B1. The drains and sources of cells C111–114 are commonly connected to sub-bit lines SB11 and SB12, respectively. The gate of each cell C11k, k=1 . . . 4, is connected to a corresponding word line W1k. The drain of segment select device S11 is connected to bit line B1, while its source is connected to sub-bit line SB11. The gate of device S11 is connected to segment select word line WS1.

Sub-bit line SB12 is connected to bit line B2 through segment select device S12. The gate of device S12 is connected to segment select word line WS1. The drains of memory cells C12k are commonly connected to sub-bit line SB12, and thus to the sources of memory cells C11k. The segment arrangement described above continues for other segments.

Memory cells C21k are part of a segment that is aligned with the segment of cells C11k along the Y-column direction, and is situated opposite the segment of cells C11k relative to segment select device S11. Memory cells C21k have their drains and sources commonly connected to sub-bit lines SB21 and SB22, respectively. Sub-bit lines SB21, SB22 are connected to bit lines B1 and B2 through segment select devices S21 and S22, respectively. Segment select devices S1j, S2j form two parallel rows adjacent along the Y-column direction.

Sub-bit lines SB1j may or may not be connected to the sub-bitlines of an adjacent sector (not shown) situated opposite the sector of cells C1jk along the Y-column direction. In FIG. 12, such a sector would be positioned above cells C1jk. If the sub-bit lines in the two sectors are connected, the voltages applied to the segment select lines WS of the two sectors are preferably coordinated to be equal during the operation of the array.

Preferably, bit lines Bn are metal lines defined on the semiconductor substrate, while the other conductive lines are defined within the semiconductor structure of the array. The only required metal contacts are those between the drains of segment select devices Sij and the corresponding bit lines Bn. Compared to conventional NOR architectures employing a metal contact for every two memory cells, the presently described preferred architecture allows a reduction in the surface area per memory cell employed for metal contacts.

The preferred operation of the segmented bit line page memory array architecture of FIG. 12 is illustrated in Table 1 below.

| Operation Mode: | WS1 | WS2 | W11 | W12 | W13 | W14 | B1 | B2 | B3 | B4 | B5 |
|---|---|---|---|---|---|---|---|---|---|---|---|
| Sector Erase | 3 | — | 14 | 14 | 14 | 14 | 0 | 0 | 0 | 0 | 0 |
| Write | 17 | — | 3 | 0 | 3 | 0 | 14 | Float | Float | Float | Float |
| Read, 1$^{st}$ pass | 3 | 0 | 0 | 3 | 0 | 0 | 0 | 3 | 3 | 0 | 3 |
| Read, 2$^{nd}$ pass | 3 | 0 | 0 | 3 | 0 | 0 | 3 | 3 | 0 | 3 | 3 |

To erase all data within the sector i=1, all bit lines Bn are grounded while all word lines W1j within the sector are held at a high erase voltage, e.g. 14 V. Segment select word line WS1 is held at a passage voltage, e.g. 3 V, to allow passage of current from bit lines Bn to sub-bit lines SB1n, i=1 . . . 5.

The write operation illustrated in Table 1 is for memory cells C111–114 for data 1010. Bit line B1 corresponding to cells C111–114 is held at a write voltage, e.g. 14 V, while the other bit lines are floated. Segment select line WS1 is held at a write voltage, e.g. 17 V, to allow current passage from bit line B1 to the drains of memory cells C111-114. If a logic "1" is to be left stored within given memory cells, a first write voltage (e.g. 3 V) is applied to the word lines corresponding to the cells. If a logic "0" is to be written to other memory cells, the corresponding word lines are grounded or held at a lower voltage.

Data is read in two passes: data is read from some of the array segments in the first pass, and from the remaining segments in the second pass. The read operation illustrated in Table 1 is for the memory cells connected to the word line W12 between the bit line B1–B5. Current sensing is performed on bit lines B2, B3, and B5 during the first pass. Current sensing is performed on bit lines B2 and B4 during the second pass. As illustrated by the data in Table 1, in the first pass data is read from all memory cells along W12 except for the cell flanked by sub-bit lines SB12 and SB13. The datum stored in the memory cell flanked by sub-bit lines SB12 and SB13 is read in the second pass.

Two read passes are used since a sub-bit line SBin held at 3 V can be flanked at most by one adjacent sub-bit line SBin held at ground. Consider a sub-bit line SBin held at 3 V in the first read pass. If one sub-bit line neighbor of the sub-bit line SBin is grounded, the neighboring sub-bit line on the other side of SBin is held at 3 V, so as to allow only one current path out of the sub-bit line SBin. No current flows through the memory cells flanked on both sides by 3 V, and the data in those cells is read in the second pass.

Figure 13A:
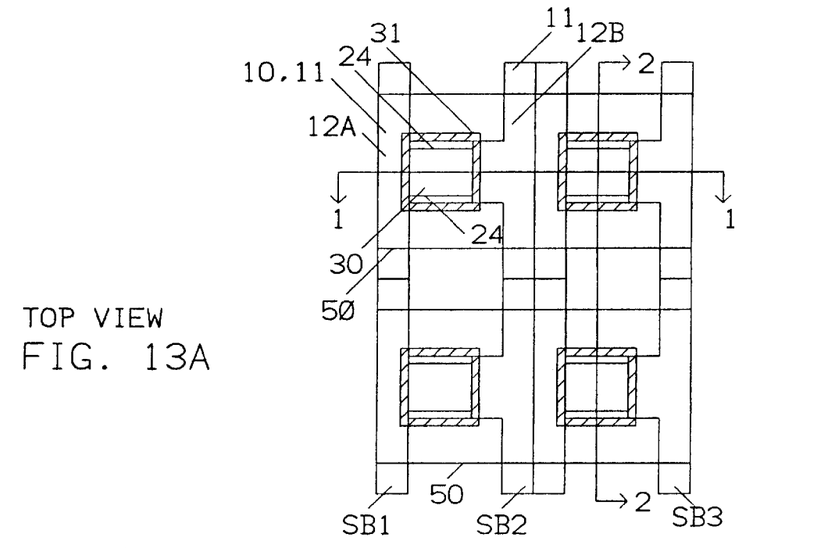
FIGS. 13A through 13C show a top view and two cross-sectional views along 1—1 and 2—2 of the preferred semiconductor structure of four EEPROM cells arranged in the architecture of FIG. 12.
Figure 13B:
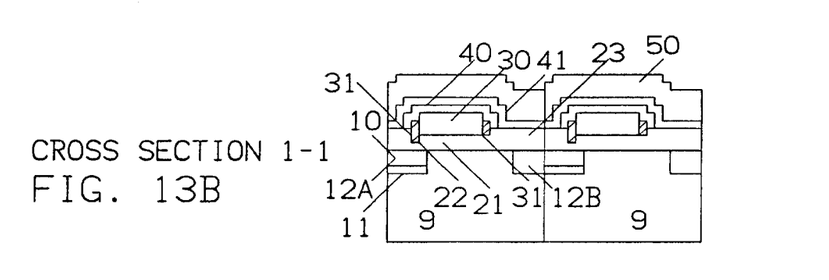
Figure 13C:
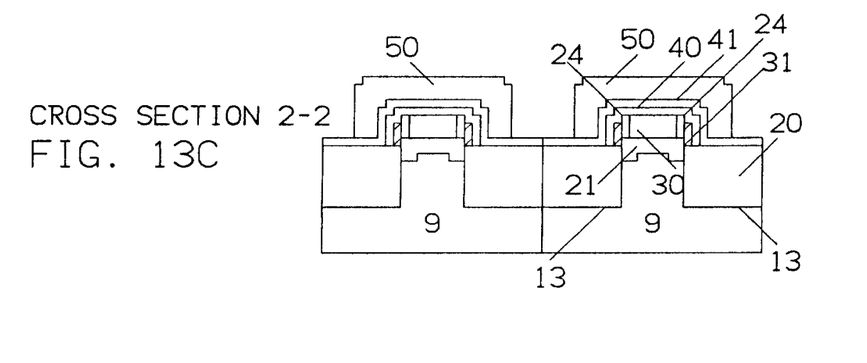

FIGS. 13A through 13C illustrate the preferred semiconductor structure for four adjacent memory cells Cijk, e.g. cells C111, C112, C121, C122. The notation of FIGS. 2A through 6C is used for the semiconductor structure. As illustrated, all connections between the cells are formed by conductive lines extending through the semiconductor structure of the array. Sub-bit lines Sbin are formed by diffusion areas defined within substrate 9, while word lines Wij are formed by the second layer of polysilicon 50. The only metal lines are the bit lines Bin (shown in FIG. 12).

The present invention has been set forth in the form of one preferred embodiment for the EEPROM memory cells, drain engineering of the first polysilicon devices, and the segmented bit line page EEPROM memory array architecture. Various modifications of the preferred embodiment disclosed herein may be made by those skilled in the art upon reference to this disclosure without departing from the scope and the spirit of the present invention. Moreover, such modifications are considered to be within the purview of the appended claims.

What is claimed is:

1. A method of writing data comprising:
    establishing an EEPROM segmented bit line page memory array comprising:
        a plurality of bit lines extending in a Y column-direction;
        a plurality of word lines extending in an X row-direction;
        a plurality of sub-bit lines extending in the Y column-direction;
        a plurality of segment select word lines extending in the X-row direction;
        a plurality of segment select devices arranged in a segment select row, each of the segment select devices connecting one of the sub-bit lines to a corresponding one of the bit-lines, wherein plural gates of the segment select devices in the segment select row are connected to one of the segment select word lines; and
        a plurality of EEPROM floating gate memory devices arranged in the X-row and Y-column directions, wherein:
            each of the memory devices connects adjacent sub-bit lines, and
            corresponding control gates of plural memory devices in a memory device row are electrically connected to one of the word lines;
    selecting a first array segment for writing, the first array segment corresponding to a first bit line, a first sub-bit line, a first segment select word line, and a first subset of memory devices corresponding to a first subset of word lines and to the first bit line;
    applying a first positive write voltage selectively to the first bit line;
    applying a first positive select voltage to a the first segment select word line while applying the first positive write voltage to the first bit line, to connect the first sub-bit line to the first bit line;
    applying a non-negative voltage data pattern to the first subset of word lines while applying the first positive write voltage to the first bit line, thereby applying the non-negative voltage data pattern to a set of gates of the first subset of memory devices, wherein each voltage in the non-negative voltage pattern is lower than the first write voltage; and
    after writing data in the first array segment corresponding to the first bit line, sequentially selecting array segments other than the first array segment for writing.

2. A method of erasing data in an EEPROM segmented bit line page memory array, comprising:
    establishing an EEPROM segmented bit line page memory array comprising:
        a plurality of bit lines extending in a Y column-direction;
        a plurality of word lines extending in an X row-direction;
        a plurality of sub-bit lines extending in the Y column-direction;
        a plurality of segment select word lines extending in the X-row direction;
        a plurality of segment select devices arranged in a segment select row, each of the segment select devices connecting one of the sub-bit lines to a corresponding one of the bit-lines, wherein plural gates of the segment select devices In the segment select row are connected to one of the segment select word lines: and
        a plurality of EEPROM floating gate memory devices arranged in the X-row and Y-column directions, wherein:
            each of the memory devices connects adjacent sub-bit lines, and
            corresponding control gates of plural memory devices in a memory device row are electrically connected to one of the word lines;
    selecting a first array sector for erasure, the first array sector corresponding to a first subset of bit lines, a first subset of corresponding sub-bit lines, a first segment select word line, and a first subset of memory devices:
    applying a first positive select voltage to the segment select word line to connect the each sub-bit line in the first subset of sub-lines to a corresponding bit line in the first subset of bit lines;
    grounding each bit line in the first subset of bit lines; and
    applying a positive erase voltage to each word line in the first subset of word lines.

* * * * *